US012063028B2

(12) United States Patent
Takeuchi

(10) Patent No.: US 12,063,028 B2
(45) Date of Patent: Aug. 13, 2024

(54) HIGH-FREQUENCY MODULE AND COMMUNICATION DEVICE

(71) Applicant: Murata Manufacturing Co., Ltd., Kyoto (JP)

(72) Inventor: Morio Takeuchi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 322 days.

(21) Appl. No.: 17/646,358

(22) Filed: Dec. 29, 2021

(65) Prior Publication Data

US 2022/0123732 A1 Apr. 21, 2022

Related U.S. Application Data

(63) Continuation of application No. PCT/JP2020/022675, filed on Jun. 9, 2020.

(30) Foreign Application Priority Data

Jul. 2, 2019 (JP) ................... 2019-124047

(51) Int. Cl.
*H03H 9/64* (2006.01)
*H03F 3/19* (2006.01)
(Continued)

(52) U.S. Cl.
CPC .............. *H03H 9/64* (2013.01); *H03F 3/19* (2013.01); *H03H 9/25* (2013.01); *H03H 9/725* (2013.01);
(Continued)

(58) Field of Classification Search
CPC ......... H03F 2200/294; H03F 2200/451; H03F 3/19; H03H 9/25; H03H 9/64; H03H 9/725; H04B 1/00; H04B 1/38; H04B 1/40
See application file for complete search history.

(56) References Cited

U.S. PATENT DOCUMENTS

2015/0133067 A1* 5/2015 Chang ................. H04L 5/14 455/78
2016/0197643 A1 7/2016 Jejima
(Continued)

FOREIGN PATENT DOCUMENTS

KR 2018-0058807 A 6/2018
KR 2019-0040041 A 4/2019
(Continued)

OTHER PUBLICATIONS

International Search Report for International Patent Application No. PCT/JP2020/022675 dated Aug. 4, 2020.
(Continued)

*Primary Examiner* — Nguyen T Vo
(74) *Attorney, Agent, or Firm* — Pearne & Gordon LLP

(57) ABSTRACT

A high-frequency module includes a mounting substrate, a first antenna switch, a second antenna switch, a filter (303), and a filter (307). The filter (303) and the filter (307) are respectively connected with an output terminal (204) and an output terminal (208). The second antenna switch is configured to be able to simultaneously execute connection between an input terminal and the output terminal (204) and connection between the input terminal and the output terminal (208). In plan view of the mounting substrate, a distance between an antenna terminal and the first antenna switch is shorter than a distance between the antenna terminal and the second antenna switch. A distance between the first antenna switch and the filter (303) is longer than a distance between the second antenna switch and the filter (303).

15 Claims, 7 Drawing Sheets

(51) Int. Cl.
*H03H 9/25* (2006.01)
*H03H 9/72* (2006.01)
*H04B 1/40* (2015.01)

(52) U.S. Cl.
CPC ......... *H04B 1/40* (2013.01); *H03F 2200/294* (2013.01); *H03F 2200/451* (2013.01)

(56) References Cited

U.S. PATENT DOCUMENTS

| | | | |
|---|---|---|---|
| 2018/0019730 A1* | 1/2018 | Takeuchi | ................. H03H 9/72 |
| 2018/0226928 A1 | 8/2018 | Obiya et al. | |
| 2018/0227006 A1 | 8/2018 | Yasuda | |
| 2019/0214355 A1 | 7/2019 | Nishikawa | |
| 2020/0007096 A1* | 1/2020 | Kita | ....................... H04B 1/006 |

FOREIGN PATENT DOCUMENTS

| | | |
|---|---|---|
| WO | 2015/041125 A1 | 3/2015 |
| WO | 2017/057567 A1 | 4/2017 |
| WO | 2017/073509 A1 | 5/2017 |
| WO | 2018/168500 A1 | 9/2018 |

OTHER PUBLICATIONS

Written Opinion for International Patent Application No. PCT/JP2020/022675 dated Aug. 4, 2020.

\* cited by examiner

HIGH-FREQUENCY MODULE AND COMMUNICATION DEVICE

CROSS REFERENCE TO RELATED APPLICATIONS

This is a continuation of International Application No. PCT/JP2020/022675 filed on Jun. 9, 2020 which claims priority from Japanese Patent Application No. 2019-124047 filed on Jul. 2, 2019. The contents of these applications are incorporated herein by reference in their entireties.

BACKGROUND ART

Technical Field

The present disclosure generally relates to a high-frequency module and a communication device, and more specifically relates to a high-frequency module and a communication device for performing communication of high-frequency signals.

There have been conventionally known high-frequency modules that are capable of transmitting and receiving a plurality of communication signals whose frequency bands are different from each other (see Patent Document 1, for example).

The high-frequency module of Patent Document 1 includes a switch IC that is connected with an antenna terminal, a plurality of SAW duplexers, and a plurality of SAW filters. The switch IC is connected with each of the SAW duplexers and each of the SAW filters. The switch IC includes a plurality of selected terminals and a common terminal that is connected with an antenna connection terminal. Each of the plurality of selected terminals is connected with a corresponding filter circuit among the SAW duplexers and the SAW filters.

Patent Document 1: International Publication No. 2015/041125

BRIEF SUMMARY

When the high-frequency module of Patent Document 1 is applied to carrier aggregation, a signal is sent to two filters, for example. Specifically, the signal passes through a signal path between one filter of the two filters and the switch IC (antenna switch) and a signal path between the other filter and the antenna switch. If the signal paths are long, filter characteristics may be degraded. Further, in order not to generate signal loss in wiring between the antenna terminal and the antenna switch, the common terminal (connection terminal) of the antenna switch needs to be arranged close to the antenna terminal.

The present disclosure provides a high-frequency module and a communication device that can suppress degradation in filter characteristics while suppressing possibility of signal loss generation in wiring from an antenna terminal to a switch.

A high-frequency module according to one aspect of the present disclosure includes a mounting substrate, an antenna terminal, a first antenna switch, a second antenna switch, a first filter, and a second filter. The first antenna switch includes a connection terminal that is connected with the antenna terminal and a selection terminal that is connected with the connection terminal. The second antenna switch is connected with the selection terminal. The first filter and the second filter are connected with the second antenna switch. The second antenna switch includes a common terminal and a first selection terminal and a second selection terminal that are connected with the common terminal. The first filter is connected with the first selection terminal of the second antenna switch. The second filter is connected with the second selection terminal of the second antenna switch. The second antenna switch is configured to be able to simultaneously execute connection between the common terminal of the second antenna switch and the first selection terminal and connection between the common terminal of the second antenna switch and the second selection terminal. In plan view of the mounting substrate, a distance between the antenna terminal and the first antenna switch is shorter than a distance between the antenna terminal and the second antenna switch, and a distance between the first antenna switch and the first filter is longer than a distance between the second antenna switch and the first filter.

A communication device according to one aspect of the present disclosure includes the high-frequency module and a signal processing circuit that performs signal processing.

Advantageous Effects of Disclosure

According to the present disclosure, degradation in filter characteristics can be suppressed while suppressing possibility of signal loss generation in wiring from an antenna terminal to a switch.

DETAILED DESCRIPTION

Figure 1:
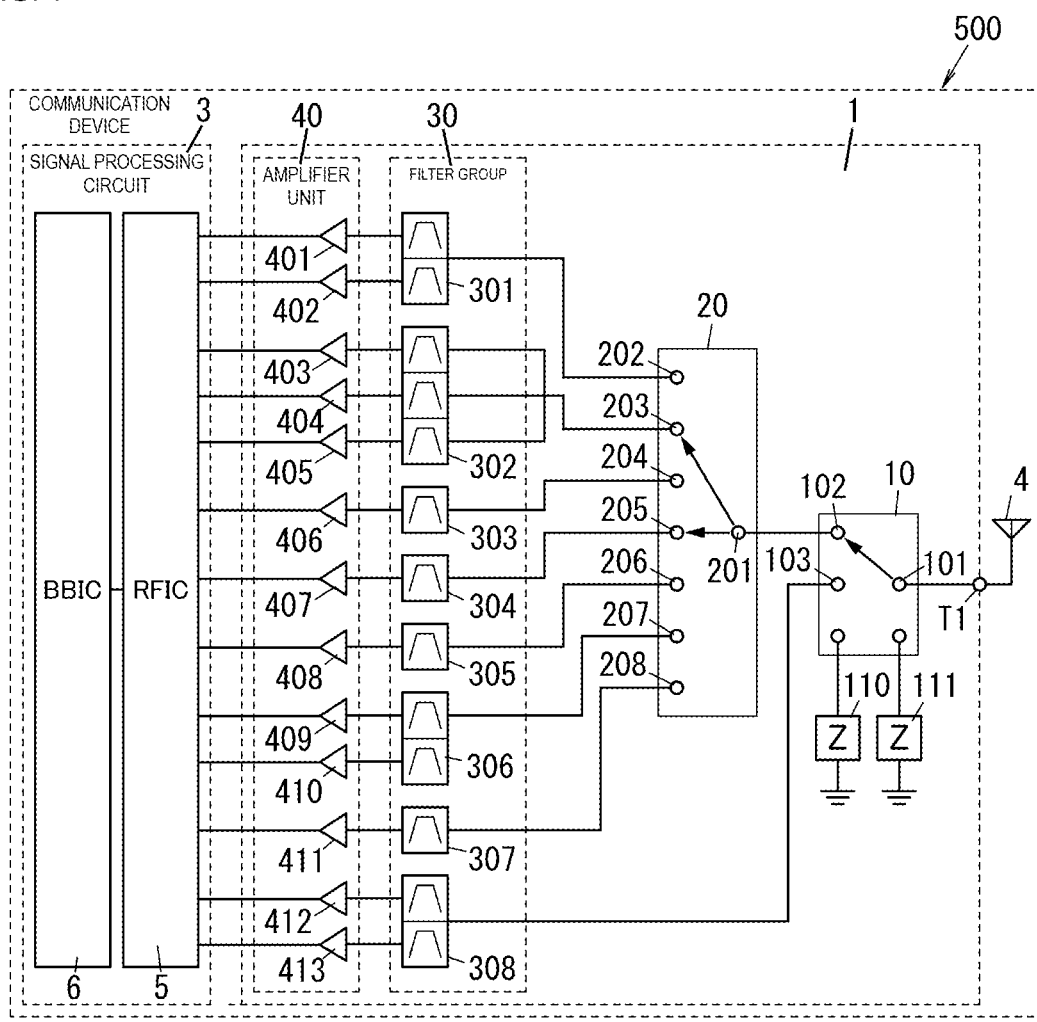
FIG. 1 is a schematic circuit diagram for explaining a high-frequency module according to a first embodiment.

Each of FIGS. 1 to 7 referred to in the following embodiments and the like is a schematic view, and ratios of sizes and thicknesses of components in the drawings do not necessarily reflect actual dimensional ratios.

First Embodiment

A high-frequency module 1 and a communication device 500 according to the present embodiment will be described below with reference to FIGS. 1 to 2B.

(1) Whole Configuration of High-Frequency Module

The high-frequency module 1 according to the embodiment is used for the communication device 500 that is multimode/multiband compatible, for example. The communication device 500 is, for example, a mobile phone (such as a smart phone). However, not limited to this, the communication device 500 may be, for example, a wearable terminal (such as a smart watch).

The high-frequency module 1 is provided in the communication device 500 that is multiband compatible and conforms to communication standards of long term evolution (LTE) and the like. The high-frequency module 1 receives a signal via an antenna 4 provided to the communication device 500, applies amplification processing and the like to the received signal, and outputs the signal to a signal processing circuit 3 that processes a high-frequency signal.

(2) Components of Communication Device

The communication device 500 includes the high-frequency module 1, the antenna 4, and the signal processing circuit 3, as illustrated in FIG. 1.

Figure 2A:
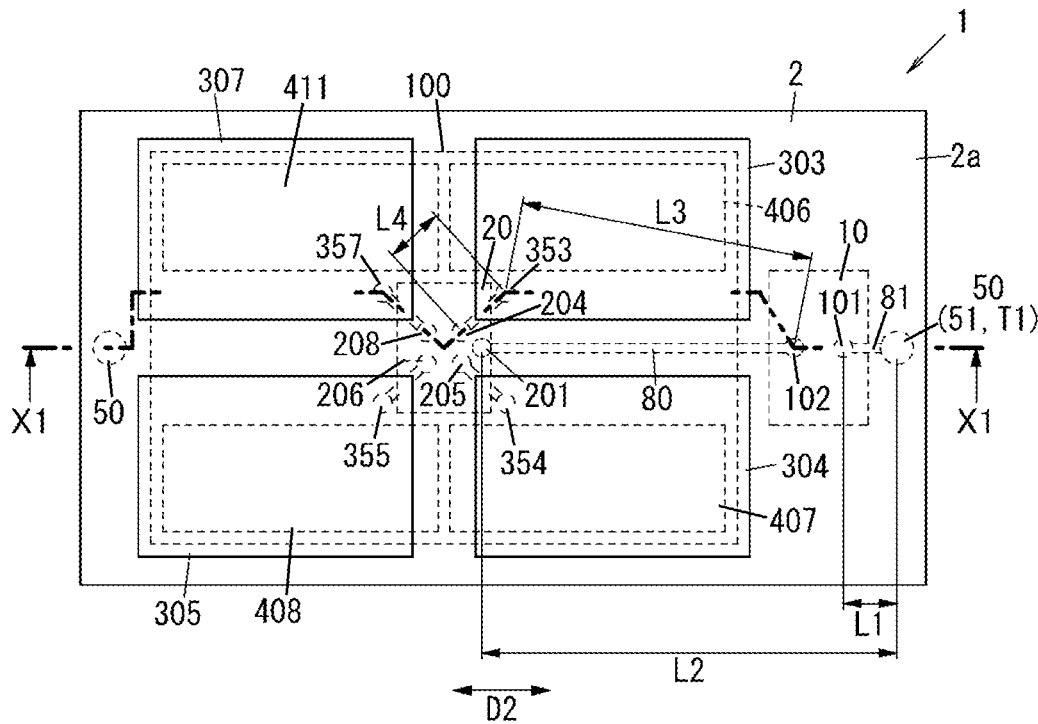
FIG. 2A is a schematic plan view for explaining a configuration of the same high-frequency module.
Figure 2B:
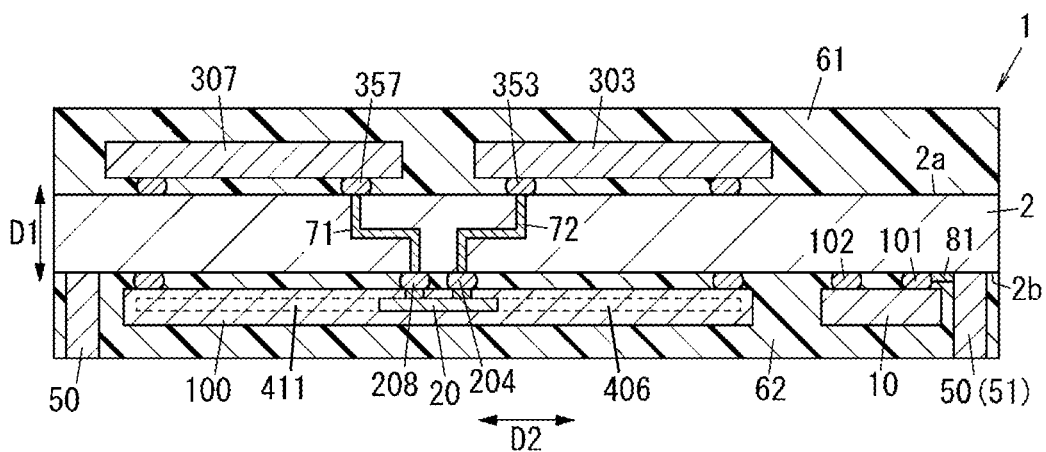
FIG. 2B is an X1-X1 sectional view of FIG. 2A.

The high-frequency module 1 according to the present embodiment includes a mounting substrate 2, a first antenna switch 10, a second antenna switch 20, a filter group 30, and an amplifier unit 40, as illustrated in FIG. 1 and FIGS. 2A and 2B.

A switch integrated circuit (IC) 100 that is a semiconductor device is configured by forming the second antenna switch 20 and the amplifier unit 40 in one chip.

The mounting substrate 2 is a double-sided mounting substrate and has a first main surface 2a and a second main surface 2b that face each other in a first direction D1 that is the thickness direction of the mounting substrate 2 (a direction perpendicular to the first main surface 2a). Components constituting the high-frequency module 1 are provided on the first main surface 2a and the second main surface 2b. For example, filters 301 to 308 included in the filter group 30 are provided on the first main surface 2a. At least one of the switch IC 100 and the first antenna switch 10 is provided on the second main surface 2b. In other words, at least one of the second antenna switch 20 and the first antenna switch 10 is provided on the second main surface 2b. Both of the switch IC 100 and the first antenna switch 10 are provided on the second main surface 2b, in the present embodiment.

The first antenna switch 10 is connected to the antenna 4. Specifically, an input terminal 101 of the first antenna switch 10 is connected to an antenna terminal T1 that is connected to the antenna 4. An output terminal 102 of the first antenna switch 10 is connected to an input terminal of the second antenna switch 20. An output terminal 103 of the first antenna switch 10 is connected to an input terminal of the filter 308 that is included in the filter group 30. The first antenna switch 10 selects either of the output terminals 102 and 103 as a connection destination of the input terminal 101 in accordance with a received signal by the control of the signal processing circuit 3. Further, connection is also performed to at least one of matching circuits 110 and 111 depending on a connection destination of the input terminal 101.

The first antenna switch 10 is controlled by the signal processing circuit 3, for example. The first antenna switch 10 switches a connecting state of the first antenna switch 10 in accordance with a control signal from an RF signal processing circuit 5 of the signal processing circuit 3.

The second antenna switch 20 is included in the switch IC 100 as described above. The second antenna switch 20 is connected with the first antenna switch 10. An input terminal 201 of the second antenna switch 20 is connected with the output terminal 102 of the first antenna switch 10. A plurality (seven pieces in the example of the drawing) of output terminals 202 to 208 of the second antenna switch 20 are connected with a plurality of filters 301 to 307 (see FIG. 1) included in the filter group 30 in one-to-one correspondence.

The second antenna switch 20 is controlled by the signal processing circuit 3, for example. The second antenna switch 20 switches a connecting state of the second antenna switch 20 in accordance with a control signal from the RF signal processing circuit 5 of the signal processing circuit 3.

The second antenna switch 20 is configured to be able to be simultaneously connected with a plurality of filters included in the filter group 30. That is, the input terminal 201 of the second antenna switch 20 can be simultaneously connected with two or more output terminals among the output terminals 202 to 208. Accordingly, the high-frequency module 1 is applicable to carrier aggregation for performing simultaneous communication in a plurality of frequency bands, that is, for simultaneously communicating signals of mutually-different communication bands. Here, the second antenna switch 20 may be connected with one filter included in the filter group 30.

The filter group 30 includes the plurality of filters 301 to 308. The plurality of filters 301 to 308 are, for example, acoustic wave filters and each of a plurality of serial arm resonators and a plurality of parallel arm resonators is composed of an acoustic wave resonator. An acoustic wave filter is a surface acoustic wave (SAW) filter using a surface acoustic wave, for example. Here, the plurality of filters 301 to 308 are not limited to SAW filters. The plurality of filters may be, for example, bulk acoustic wave (BAW) filters as well as SAWs. Alternatively, the plurality of filters 301 to 308 may be composed of film bulk acoustic resonators (FBAR) or the like. Also, the filters 301 to 308 may be composed of LC resonance circuits or the like.

The filter 302 is, for example, a triplexer in which a common terminal is used as input terminals of three filters. Further, the filters 301, 306, and 308 are, for example, duplexers in each of which a common terminal is used as input terminals of two filters.

The input terminals of the filters 301 to 307 are connected with the plurality of output terminals 202 to 208 of the second antenna switch 20 in one-to-one correspondence. The filter 308 is connected with the output terminal 103 of the first antenna switch 10.

The amplifier unit 40 includes a plurality of low noise amplifiers 401 to 413. Each of the low noise amplifiers 401 to 413 amplifies a signal coming through a corresponding filter. An input terminal of each of the low noise amplifiers 401 to 413 is connected with an output terminal of a corresponding filter. An output terminal of each of the low noise amplifiers 401 to 413 is connected to the signal processing circuit 3.

The signal processing circuit 3 includes, for example, the RF signal processing circuit 5 and a baseband signal processing circuit 6. The RF signal processing circuit 5 is a radio frequency integrated circuit (RFIC), for example, and performs signal processing with respect to a high-frequency signal. The baseband signal processing circuit 6 is a baseband integrated circuit (BBIC), for example, and performs predetermined signal processing. A reception signal processed in the baseband signal processing circuit 6 is used, for example, for image display as an image signal or for calling as a voice signal. The high-frequency module 1 transmits a high-frequency signal (a reception signal in this example) between the antenna 4 and the RF signal processing circuit 5 of the signal processing circuit 3. The baseband signal processing circuit 6 is not a required component in the communication device 500.

An arrangement of the first antenna switch 10, the second antenna switch 20, and a plurality of filters in the high-frequency module 1 will now be described. In this description, the filters 303, 304, 305, and 307 illustrated in FIG. 1 are used as the plurality of filters.

FIG. 2A illustrates a plan view of the high-frequency module 1 viewed in the first direction D1, and FIG. 2B illustrates a sectional view of the high-frequency module 1.

The high-frequency module 1 includes a plurality of external connection electrodes 50. The plurality of external connection electrodes 50 connect the high-frequency module 1 to a mother substrate on which the signal processing circuit 3 and the like are mounted. The plurality of external connection electrodes 50 are columnar-shaped (for example, cylindrical-shaped) electrodes provided on the second main surface 2b of the mounting substrate 2. The material of the plurality of external connection electrodes 50 is, for example, metal (such as copper and a copper alloy).

The high-frequency module 1 receives a signal, which is received by the antenna 4, via an external connection electrode 50 and outputs the signal to the RF signal processing circuit 5 of the signal processing circuit 3 via another external connection electrode 50. In the present embodiment, an external connection electrode 51 among the plurality of external connection electrodes 50 corresponds to the antenna terminal T1 mentioned above. The external connection electrode 51 serving as the antenna terminal T1 is connected to the input terminal 101 of the first antenna switch 10 via a conductor 81 (see FIGS. 2A and 2B).

The high-frequency module 1 further includes a first resin layer 61 on the first main surface 2a of the mounting substrate 2. The first resin layer 61 covers electronic components such as the filter group 30 mounted on the first main surface 2a. The high-frequency module 1 further includes a second resin layer 62 on the second main surface 2b of the mounting substrate 2. The second resin layer 62 covers electronic components such as the switch IC 100 and the first antenna switch 10 mounted on the second main surface 2b. The material of the second resin layer 62 may be the same material as the material of the first resin layer 61 or may be a different material. Here, FIG. 2A omits the first resin layer 61.

The switch IC 100 and the first antenna switch 10 are arranged on the second main surface 2b of the mounting substrate 2, as described above (see FIG. 2B). The second antenna switch 20 included in the switch IC 100 and the first antenna switch 10 are arranged along the second direction D2 (see FIGS. 2A and 2B). The second antenna switch 20 is connected with the first antenna switch 10 via a conductor 80. Specifically, the input terminal 201 of the second antenna switch 20 is connected with the output terminal 102 of the first antenna switch 10 via the conductor 80 (see FIG. 2A).

In plan view of the mounting substrate 2 (viewed in a direction perpendicular to a main surface of the mounting substrate 2), a distance L1 between the external connection electrode 51 serving as the antenna terminal T1 and the first antenna switch 10 is shorter than a distance L2 between the antenna terminal T1 and the second antenna switch 20. The distance L1 between the external connection electrode 51 serving as the antenna terminal T1 and the first antenna switch 10 is a distance from the antenna terminal T1 to the input terminal 101 of the first antenna switch 10 in plan view of the mounting substrate 2. The distance L2 between the antenna terminal T1 and the second antenna switch 20 is a distance from the antenna terminal T1 to the input terminal 201 of the second antenna switch 20 in plan view of the mounting substrate 2.

The filters 303, 304, 305, and 307 are arranged on the first main surface 2a of the mounting substrate 2, as described above (see FIG. 2B). In the present embodiment, the filter 303 and the filter 307 are simultaneously connected with the second antenna switch 20, and the filter 304 and the filter 305 are simultaneously connected with the second antenna switch 20.

The two filters 303 and 307 that are simultaneously connected are arranged along the second direction D2 (see FIG. 2A). In a similar manner, the two filters 304 and 305 that are simultaneously connected are arranged along the second direction D2 (see FIG. 2A).

The filter 307 is connected with the second antenna switch 20 through a via 71 formed in the mounting substrate 2 (see FIG. 2B). The filter 303 is connected with the second antenna switch 20 through a via 72 formed in the mounting substrate 2 (see FIG. 2B). The filter 304 is connected with the second antenna switch 20 through a via (not illustrated) formed in the mounting substrate 2. The filter 305 is connected with the second antenna switch 20 through a via (not illustrated) formed in the mounting substrate 2.

A distance L3 between the first antenna switch 10 and the filter 303 is longer than a distance L4 between the second antenna switch 20 and the filter 303. The distance L3 between the first antenna switch 10 and the filter 303 is a distance from the output terminal 102 of the first antenna switch 10 to an input terminal 353 of the filter 303 in plan view of the mounting substrate 2. The distance L4 between the second antenna switch 20 and the filter 303 is a distance from the output terminal 204 of the second antenna switch 20 to the input terminal 353 of the filter 303 in plan view of the mounting substrate 2. In a similar manner, a distance from the output terminal 102 of the first antenna switch 10 to an input terminal 357 of the filter 307 is longer than a distance from the output terminal 208 of the second antenna switch 20 to the input terminal 357 of the filter 307.

A distance from the output terminal 102 of the first antenna switch 10 to an input terminal 354 of the filter 304 is longer than a distance from the output terminal 205 of the second antenna switch 20 to the input terminal 354 of the filter 304. A distance from the output terminal 102 of the first antenna switch 10 to an input terminal 355 of the filter 305 is longer than a distance from the output terminal 206 of the second antenna switch 20 to the input terminal 355 of the filter 305.

More specifically, at least one filter between the filter 303 and the filter 307 is overlapped with at least a portion of the second antenna switch 20 when the mounting substrate 2 is viewed in the first direction D1, that is, in plan view of the mounting substrate 2. In the present embodiment, both of the filter 303 and the filter 307 are respectively overlapped with at least portions of the second antenna switch 20 in plan view of the mounting substrate 2.

At least one filter between the filter 304 and the filter 305 is overlapped with at least a portion of the second antenna switch 20 in plan view of the mounting substrate 2. In the present embodiment, both of the filter 304 and the filter 305 are respectively overlapped with at least portions of the second antenna switch 20 in plan view of the mounting substrate 2.

Further, at least one filter between the filter 303 and the filter 307 is overlapped with at least a portion of a corresponding low noise amplifier when the mounting substrate 2 is viewed in the first direction D1. In the present embodiment, the filter 303 is overlapped with at least a portion of the corresponding low noise amplifier 406 and the filter 307 is overlapped with at least a portion of the corresponding low noise amplifier 411 when the mounting substrate 2 is viewed in the first direction D1.

In a similar manner, at least one filter between the filter 304 and the filter 305 is overlapped with at least a portion of a corresponding low noise amplifier when the mounting substrate 2 is viewed in the first direction D1. In the present embodiment, the filter 304 is overlapped with at least a portion of the corresponding low noise amplifier 407 and the filter 305 is overlapped with at least a portion of the corresponding low noise amplifier 408 when the mounting substrate 2 is viewed in the first direction D1.

There has been exemplified the high-frequency module 1 of a receiving system that receives a signal from the antenna 4 and outputs the received signal to the RF signal processing circuit 5. However, the high-frequency module according to the present disclosure is also applicable to a high-frequency module of a transmitting system that inputs a high-frequency transmission signal outputted from the RF signal processing circuit 5 and outputs the signal to an antenna or the like. In this configuration, the amplifier unit 40 does not include the low noise amplifiers 401 to 413 but includes power amplifiers that amplify a transmission signal, for example. The transmission signal is sent in the order of the amplifier unit 40, the filter group 30, the second antenna switch 20, and the first antenna switch 10, or the order of the amplifier unit 40, the filter group 30, and the first antenna switch 10.

(3) Advantageous Effects

As described above, the high-frequency module 1 includes the mounting substrate 2, the antenna terminal T1, the first antenna switch 10, the second antenna switch 20, a first filter (for example, the filter 303), and a second filter (for example, the filter 307), in the present embodiment. The first antenna switch 10 includes a connection terminal (for example, the input terminal 101) that is connected with the antenna terminal T1 and a selection terminal (for example, the output terminal 102) that is connected with the connection terminal. The second antenna switch 20 is connected with the selection terminal (the output terminal 102). The first filter and the second filter are connected with the second antenna switch 20. The second antenna switch 20 includes a common terminal (the input terminal 201), and a first selection terminal (for example, the output terminal 204) and a second selection terminal (for example, the output terminal 208) that are connected with the common terminal. The first filter is connected with the first selection terminal and the second filter is connected with the second selection terminal of the second antenna switch. The second antenna switch 20 is configured to be able to simultaneously execute the connection between the common terminal (the input terminal 201) and the first selection terminal and the connection between the common terminal and the second selection terminal. In plan view of the mounting substrate 2, the distance L1 between the antenna terminal T1 and the first antenna switch 10 is shorter than the distance L2 between the antenna terminal T1 and the second antenna switch 20. The distance L3 between the first antenna switch 10 and the first filter is longer than the distance L4 between the second antenna switch 20 and the first filter.

This configuration can suppress possibility of signal loss generation in wiring between the antenna terminal T1 and the first antenna switch 10. Further, degradation in filter characteristics between the second antenna switch 20 and the first filter can be suppressed. Thus, the high-frequency module 1 of the first embodiment is capable of suppressing degradation in filter characteristics while suppressing possibility of signal loss generation in wiring from the antenna terminal T1 to the switch (the first antenna switch 10).

Further, at least one filter between the filter 303 and the filter 307 is overlapped with at least a portion of a corresponding low noise amplifier when the mounting substrate 2 is viewed in the first direction D1. This configuration realizes the short length of the path between the filter 303 and the low noise amplifier 406, for example.

(4) Modifications

Modifications will be listed below. Here, the modifications described below are applicable in combination with the above-described embodiment as appropriate.

(4.1) First Modification

In the above-described embodiment has exemplified the configuration in which the second antenna switch 20 and the amplifier unit 40 are included in the switch IC 100, that is, the configuration in which the second antenna switch 20 and the amplifier unit 40 are formed in one chip. However, the configuration is not limited to this.

It is not required to form the second antenna switch 20 and the amplifier unit 40 in one chip. The second antenna switch 20 and the amplifier unit 40 may be separately arranged on the second main surface 2b.

(4.2) Second Modification

In the configuration in which the second antenna switch 20 and the amplifier unit 40 are not formed in one chip, at least one antenna switch between the first antenna switch 10 and the second antenna switch 20 may be provided on the first main surface 2a.

For example, the second antenna switch 20 may be provided on the first main surface 2a. A high-frequency module 1A of this configuration will be described with reference to FIGS. 3A and 3B. Here, the same components as those in the first embodiment will be provided with the same reference characters and the description thereof will be omitted as appropriate.

Figure 3A:
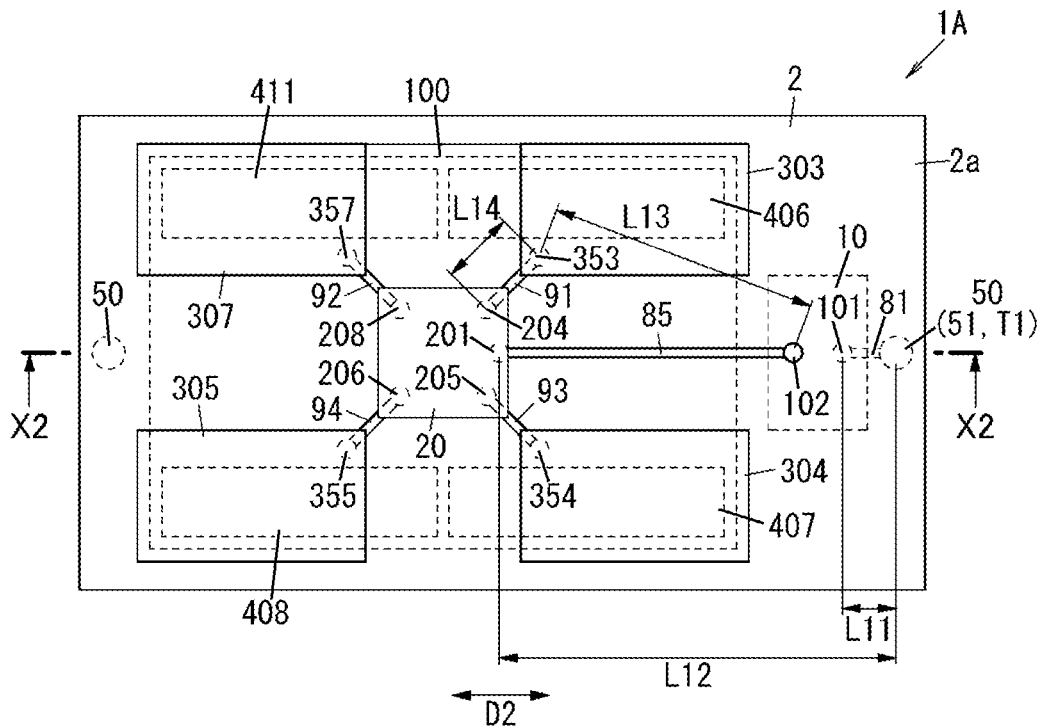
FIG. 3A is a schematic plan view for explaining a configuration of a high-frequency module according to a second modification of the first embodiment.
Figure 3B:
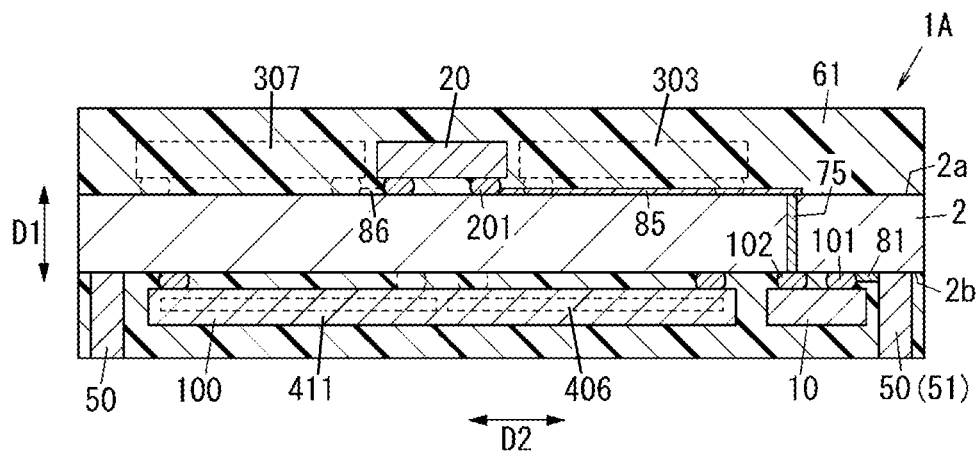
FIG. 3B is an X2-X2 sectional view of FIG. 3A.

FIG. 3A illustrates a plan view of the high-frequency module 1A viewed in the first direction D1, and FIG. 3B illustrates a sectional view of the high-frequency module 1A. Here, FIG. 3A omits the first resin layer 61.

The second antenna switch 20 is arranged on the first main surface 2a of the mounting substrate 2 in the high-frequency module 1A. That is, the second antenna switch 20 is covered by the first resin layer 61.

The second antenna switch 20 and the first antenna switch 10 are arranged along the second direction D2 in plan view of the mounting substrate 2 (see FIGS. 3A and 3B). The second antenna switch 20 is connected with the first antenna switch 10 through a via 75 formed in the mounting substrate 2 and a conductor 85 provided on the first main surface 2a. Specifically, the input terminal 201 of the second antenna switch 20 is connected with the output terminal 102 of the first antenna switch 10 through the via 75 and the conductor 85 (see FIGS. 3A and 3B).

Also in the present modification, a distance L11 between the external connection electrode 51 serving as the antenna terminal T1 and the first antenna switch 10 is shorter than a distance L12 between the antenna terminal T1 and the second antenna switch 20, in plan view of the mounting substrate 2. The distance L11 between the external connection electrode 51 serving as the antenna terminal T1 and the first antenna switch 10 is a distance from the antenna terminal T1 to the input terminal 101 of the first antenna switch 10 in plan view of the mounting substrate 2. The distance L12 between the antenna terminal T1 and the second antenna switch 20 is a distance from the antenna terminal T1 to the input terminal 201 of the second antenna switch 20 in plan view of the mounting substrate 2.

The filters 303, 304, 305, and 307 are arranged on the first main surface 2a of the mounting substrate 2, as described above (see FIG. 3B). In the present modification, the filter 303 and the filter 307 are simultaneously connected with the second antenna switch 20, and the filter 304 and the filter 305 are simultaneously connected with the second antenna switch 20, as is the case with the embodiment.

The filter 303 is connected with the second antenna switch 20 via a conductor 91 provided to the first main surface 2a (see FIG. 3A). The filter 307 is connected with the second antenna switch 20 via a conductor 92 provided to the first main surface 2a (see FIG. 3A). The filter 304 is connected with the second antenna switch 20 via a conductor 93 provided to the first main surface 2a (see FIG. 3A). The filter 305 is connected with the second antenna switch 20 via a conductor 94 provided to the first main surface 2a (see FIG. 3A).

A distance L13 between the first antenna switch 10 and the filter 303 is longer than a distance L14 between the second antenna switch 20 and the filter 303. The distance L13 between the first antenna switch 10 and the filter 303 is a distance from the output terminal 102 of the first antenna switch 10 to the input terminal 353 of the filter 303 in plan view of the mounting substrate 2. The distance L14 between the second antenna switch 20 and the filter 303 is a distance from the output terminal 204 of the second antenna switch 20 to the input terminal 353 of the filter 303 in plan view of the mounting substrate 2. In a similar manner, a distance from the output terminal 102 of the first antenna switch 10 to the input terminal 357 of the filter 307 is longer than a distance from the output terminal 208 of the second antenna switch 20 to the input terminal 357 of the filter 307.

A distance from the output terminal 102 of the first antenna switch 10 to the input terminal 354 of the filter 304 is longer than a distance from the output terminal 205 of the second antenna switch 20 to the input terminal 354 of the filter 304. A distance from the output terminal 102 of the first antenna switch 10 to the input terminal 355 of the filter 305 is longer than a distance from the output terminal 206 of the second antenna switch 20 to the input terminal 355 of the filter 305.

Also in the present modification, at least one filter between the filter 303 and the filter 307 is overlapped with at least a portion of the second antenna switch 20 when the mounting substrate 2 is viewed in the first direction D1, that is, in plan view of the mounting substrate 2, as is the case with the first embodiment. At least one filter between the filter 304 and the filter 305 is overlapped with at least a portion of the second antenna switch 20 in plan view of the mounting substrate 2.

This configuration can make the distance L14 between the second antenna switch 20 and the filter 303 shorter than the distance L13 between the first antenna switch 10 and the filter 303. A distance between the second antenna switch 20 and the filter 307 can be made shorter than a distance between the first antenna switch 10 and the filter 307. Further, a distance between the second antenna switch 20 and the filter 304 can be made shorter than a distance between the first antenna switch 10 and the filter 304. A distance between the second antenna switch 20 and the filter 305 can be made shorter than a distance between the first antenna switch 10 and the filter 305.

As a result, the length of the conductor 92 that connects the filter 307 and the second antenna switch 20 to each other, that is, the wiring length can be shortened. In a similar manner, each of the length of the conductor 91 that connects the filter 303 and the second antenna switch 20 to each other, the length of the conductor 93 that connects the filter 304 and the second antenna switch 20 to each other, and the length of the conductor 94 that connects the filter 305 and the second antenna switch 20 to each other can be shortened. That is, each wiring length can be shortened.

Further, at least one filter between the filter 303 and the filter 307 is overlapped with at least a portion of a corresponding low noise amplifier when the mounting substrate 2 is viewed in the first direction D1. In the present embodiment, the filter 303 is overlapped with at least a portion of the corresponding low noise amplifier 406 and the filter 307 is overlapped with at least a portion of the corresponding low noise amplifier 411 when the mounting substrate 2 is viewed in the first direction D1. In a similar manner, at least one filter between the filter 304 and the filter 305 is overlapped with at least a portion of a corresponding low noise amplifier when the mounting substrate 2 is viewed in the first direction D1. In the present embodiment, the filter 304 is overlapped with at least a portion of the corresponding low noise amplifier 407 and the filter 305 is overlapped with at least a portion of the corresponding low noise amplifier 408 when the mounting substrate 2 is viewed in the first direction D1.

This configuration consequently realizes the short length in each of the length of the path between the filter 303 and the low noise amplifier 406, the length of the path between the filter 307 and the low noise amplifier 411, the length of the path between the filter 304 and the low noise amplifier 407, and the length of the path between the filter 305 and the low noise amplifier 408.

(4.3) Third Modification

The high-frequency module 1 according to the first embodiment is provided with the second resin layer 62 on the second main surface 2b side of the mounting substrate 2 in a manner such that the second resin layer 62 covers the switch IC 100 and the first antenna switch 10 which are mounted on the second main surface 2b, as illustrated in FIG. 1. Further, the high-frequency module 1 includes the plurality of external connection electrodes 50, which are formed in a cylindrical shape, and is connected to the mother substrate with these plurality of external connection electrodes 50.

Figure 4:
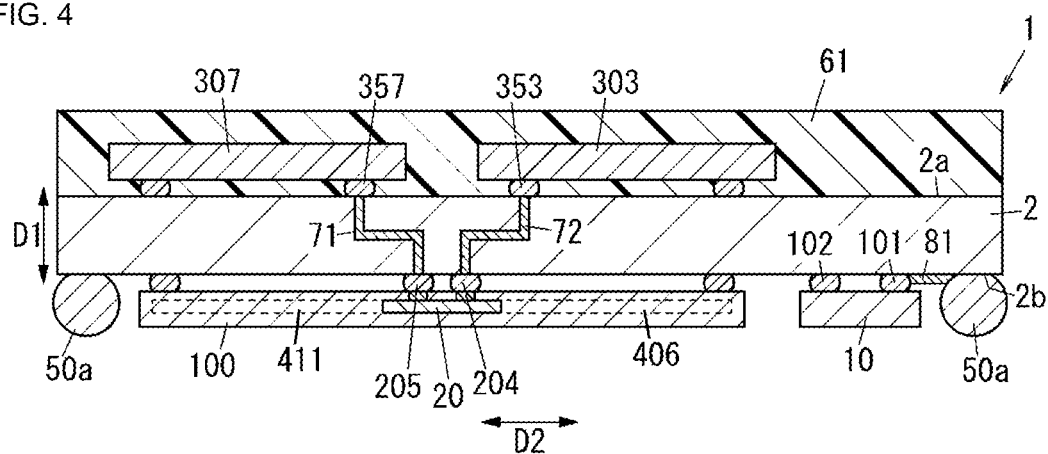
FIG. 4 is a sectional view of the high-frequency module according to the second modification of the first embodiment.

On the other hand, the second resin layer may be omitted on the second main surface 2b side of the mounting substrate 2 and the connection to the mother substrate may be performed with a plurality of external connection electrodes 50a formed in a spherical shape, as illustrated in FIG. 4.

Each of the plurality of external connection electrodes 50a is, for example, a ball bump formed in a spherical shape. The material of the ball bump is gold, copper, solder, or the like, for example.

Second Embodiment

The present embodiment is different from the first embodiment in that a high-frequency module of the present embodiment includes a plurality of third antenna switches including the above-mentioned first antenna switch 10 and a plurality of fourth antenna switches including the above-mentioned second antenna switch 20.

In the present embodiment, a high-frequency module 1B includes a high band diversity module (HB-DSM) and a multi input multi output (MIMO) module, for example.

The high-frequency module 1B and a communication device 500B according to the present embodiment will be described below focusing on the differences from the first embodiment. Here, the same components as those in the first embodiment will be provided with the same reference characters and the description thereof will be omitted.

Figure 5:
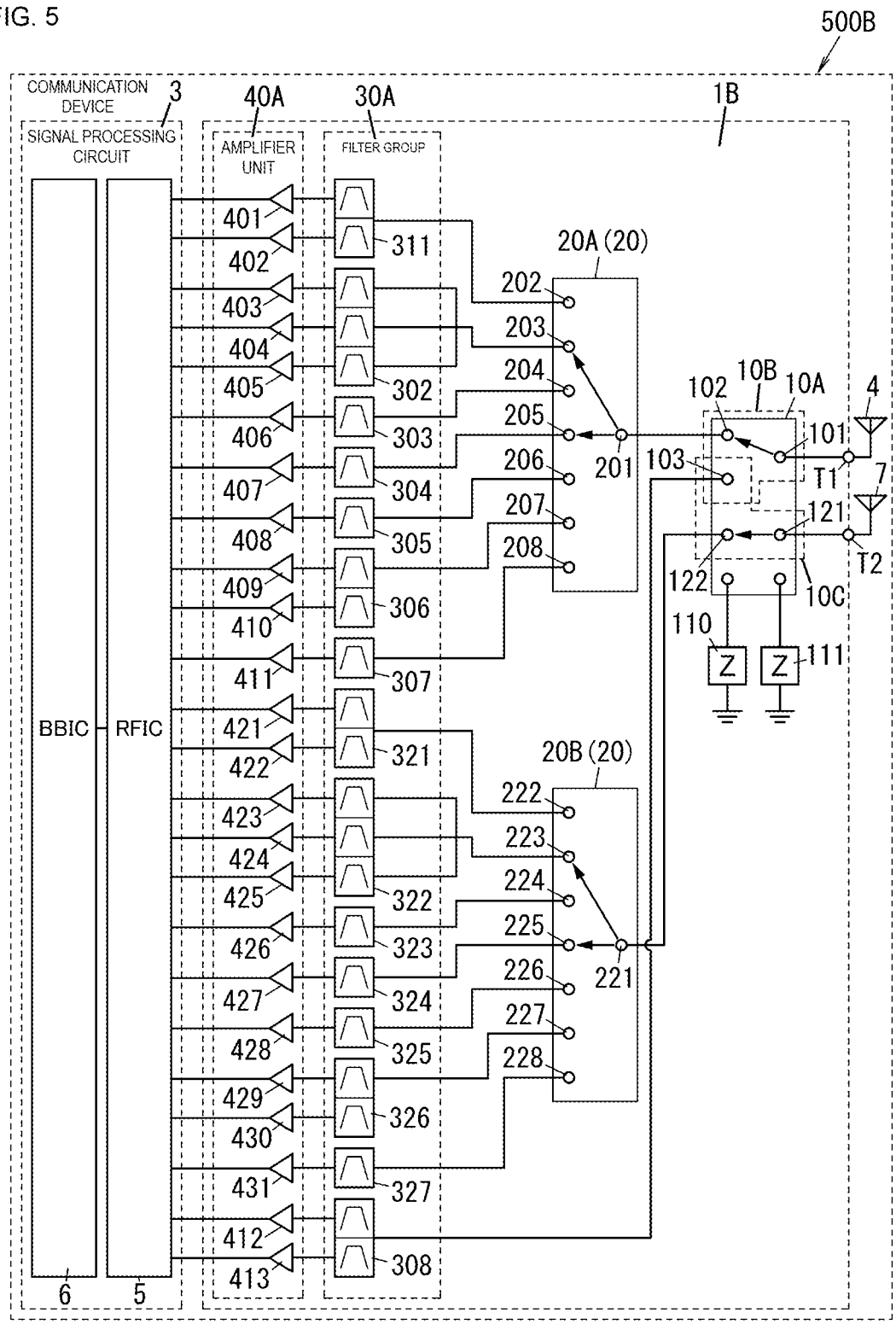
FIG. 5 is a schematic circuit diagram for explaining a high-frequency module according to a second embodiment.

The communication device 500B includes the high-frequency module 1B, the antenna 4, and the signal processing circuit 3, as illustrated in FIG. 5.

Figure 6:
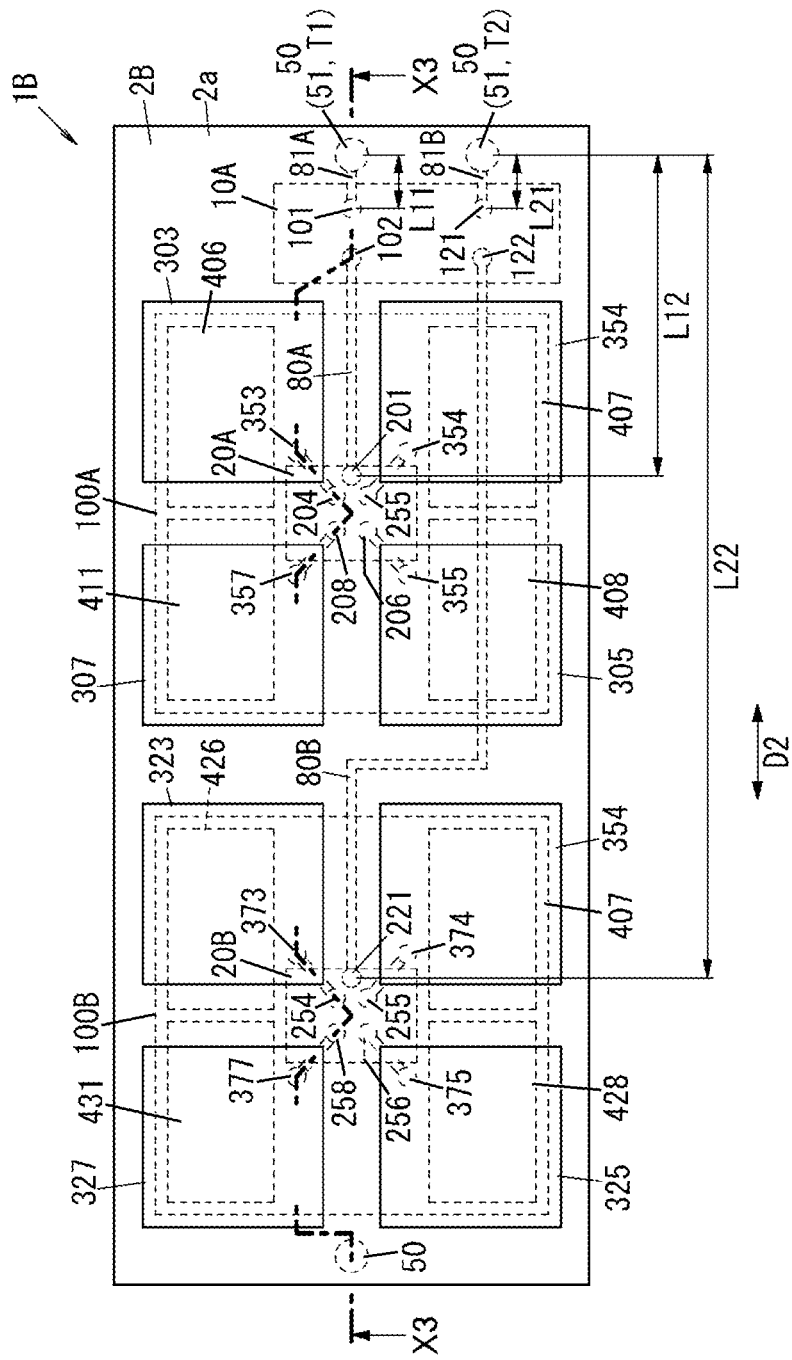
FIG. 6 is a schematic plan view for explaining a configuration of the same high-frequency module.
Figure 7:
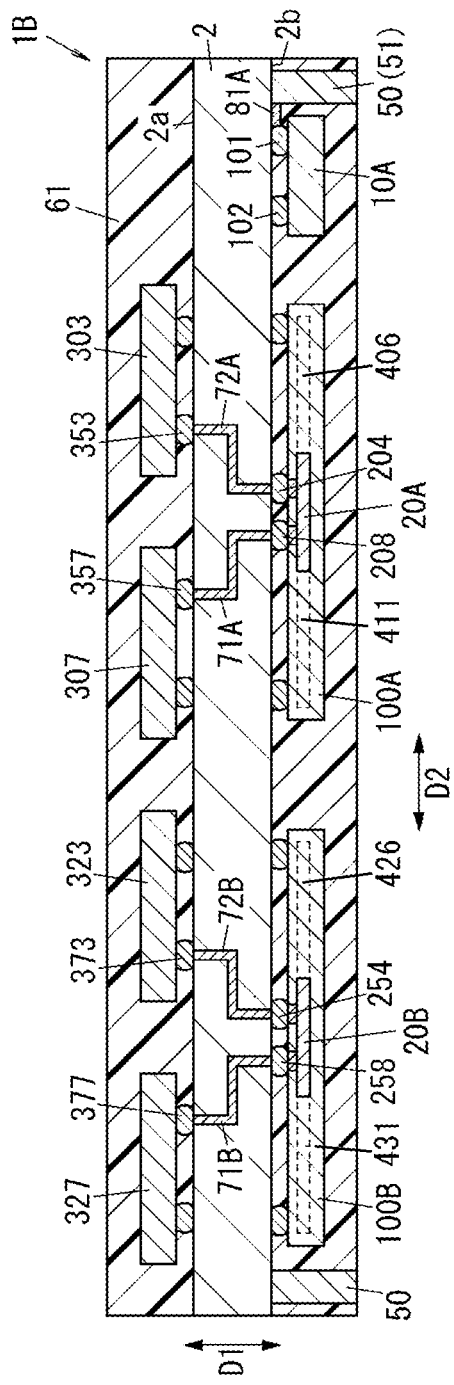
FIG. 7 is an X3-X3 sectional view of FIG. 6.

The high-frequency module 1B according to the present embodiment includes the mounting substrate 2, a first antenna switch 10A, a plurality (two pieces in the example of the drawing) of second antenna switches 20A and 20B, a filter group 30A, and an amplifier unit 40A, as illustrated in FIGS. 5 to 7. Here, the second antenna switch 20A and the second antenna switch 20B correspond to a fourth antenna switch of the present disclosure.

The first antenna switch 10A is configured by forming a third antenna switch 10B and a third antenna switch 10C, which is another third antenna switch, in one chip. The third antenna switch 10B functions as the first antenna switch 10 described in the first embodiment, and the third antenna switch 10C has a different function from that of the first antenna switch 10. In other words, the high-frequency module 1B includes a plurality (two pieces in this example) of third antenna switches 10B and 10C that are respectively connected with antenna terminals T1 and T2 which are different from each other. One third antenna switch 10B between the plurality of third antenna switches 10B and 10C functions as the first antenna switch 10 described in the first embodiment. The third antenna switch 10B includes the input terminal 101 and the output terminals 102 and 103. The third antenna switch 10C includes an input terminal 121 and output terminals 122 and 103. The output terminal 103 is not a required component of the third antenna switch 10C. Namely, the third antenna switch 10C includes at least the input terminal 121 and the output terminal 122.

Here, it is not required to form the third antenna switch 10B, which functions as the first antenna switch 10, and the third antenna switch 10C, which is another third antenna switch having a different function from that of the first antenna switch 10, in one chip. The third antenna switch 10B, which functions as the first antenna switch 10, and the third antenna switch 10C, which is another third antenna switch having a different function from that of the first antenna switch 10, may be separately provided.

The first antenna switch 10A is connected to each of two antennas 4 and 7. Specifically, the input terminal 101 of the first antenna switch 10A is connected to the antenna terminal T1 that is connected to the antenna 4. The input terminal 121 of the first antenna switch 10A is connected to the antenna terminal T2 that is connected to the antenna 7.

The output terminal 102 of the first antenna switch 10A is connected to the input terminal 201 of the second antenna switch 20A. The output terminal 103 of the first antenna switch 10A is connected to an input terminal of the filter 308 that is included in the filter group 30. The output terminal 122 of the first antenna switch 10A is connected to an input terminal 221 of the second antenna switch 20B. The first antenna switch 10A selects either of the output terminals 102 and 103 as a connection destination of the input terminal 101 in accordance with a received signal by the control of the signal processing circuit 3. The first antenna switch 10A selects either of the output terminals 122 and 103 as a connection destination of the input terminal 121 in accordance with a received signal by the control of the signal processing circuit 3. Here, connection is also performed to at least one of the matching circuits 110 and 111 depending on a connection destination of each of the input terminal 101 and the input terminal 121.

The first antenna switch 10A is controlled by the signal processing circuit 3, for example. The first antenna switch 10A switches a connecting state of the first antenna switch 10A in accordance with a control signal from the RF signal processing circuit 5 of the signal processing circuit 3.

The high-frequency module 1B includes the plurality (two pieces in the example of the drawing) of second antenna switches 20A and 20B, as described above. The plurality of second antenna switches 20A and 20B respectively correspond to the output terminals 102 and 122 of the first antenna switch 10A. In other words, the high-frequency module 1B includes a plurality of fourth antenna switches (the second antenna switches 20A and 20B) that respectively correspond to the plurality of third antenna switches 10B and 10C and are connected with the corresponding third antenna switches.

The second antenna switch 20A functions as the second antenna switch 20 described in the first embodiment. The second antenna switch 20A is connected with the first antenna switch 10A. The input terminal 201 of the second antenna switch 20A is connected with the output terminal 102 of the first antenna switch 10A. A plurality (seven pieces in the example of the drawing) of output terminals 202 to 208 of the second antenna switch 20A are connected with the plurality of filters 301 to 307 (see FIG. 5) included in the filter group 30A in one-to-one correspondence.

The second antenna switch 20A is controlled by the signal processing circuit 3, for example. The second antenna switch 20A switches a connecting state of the second antenna switch 20A in accordance with a control signal from the RF signal processing circuit 5 of the signal processing circuit 3.

The second antenna switch 20A is configured to be able to be simultaneously connected with a plurality of filters included in the filter group 30A. That is, the input terminal 201 of the second antenna switch 20A can be simultaneously connected with two or more output terminals among the output terminals 202 to 208. Here, the second antenna switch 20A may be connected with one filter included in the filter group 30A.

The second antenna switch 20B is connected with the first antenna switch 10A. The input terminal 221 of the second antenna switch 20B is connected with the output terminal 122 of the first antenna switch 10A. A plurality (seven pieces in the example of the drawing) of output terminals 222 to 228 of the second antenna switch 20B are connected with a plurality of filters 321 to 327 (see FIG. 5) included in the filter group 30A in one-to-one correspondence.

The second antenna switch 20B is controlled by the signal processing circuit 3, for example. The second antenna switch 20B switches a connecting state of the second antenna switch 20B in accordance with a control signal from the RF signal processing circuit 5 of the signal processing circuit 3.

The second antenna switch 20B is configured to be able to be simultaneously connected with a plurality of filters included in the filter group 30A. That is, the input terminal 221 of the second antenna switch 20B can be simultaneously connected with two or more output terminals among the output terminals 222 to 228. Here, the second antenna switch 20B may be connected with one filter included in the filter group 30A.

The filter group 30A includes the plurality of filters 301 to 308 and 321 to 327. The plurality of filters 301 to 308 and 321 to 327 are, for example, acoustic wave filters and each of a plurality of serial arm resonators and a plurality of parallel arm resonators is composed of an acoustic wave resonator. An acoustic wave filter is a SAW filter using a surface acoustic wave, for example. Here, the plurality of filters 301 to 308 and 321 to 327 are not limited to SAW filters. The plurality of filters may be, for example, BAW filters as well as SAWs. Alternatively, the plurality of filters 301 to 308 and 321 to 327 may be composed of FBAR or the like. Also, the filters 301 to 308 and 321 to 327 may be composed of LC resonance circuits or the like.

The filters 302 and 322 are, for example, triplexers in each of which a common terminal is used as input terminals of three filters. Further, the filters 301, 306, 308, 321, and 326 are, for example, duplexers in each of which a common terminal is used as input terminals of two filters.

The input terminals of the filters 301 to 307 are connected with the plurality of output terminals 202 to 208 of the second antenna switch 20A in one-to-one correspondence. The filter 308 is connected with the output terminal 103 of the first antenna switch 10A. The input terminals of the filters 321 to 327 are connected with the plurality of output terminals 222 to 228 of the second antenna switch 20B in one-to-one correspondence.

The second antenna switch 20A functioning as the second antenna switch 20 of the first embodiment can be simultaneously connected with at least two filters among the filters 301 to 307. The second antenna switch 20B can be simultaneously connected with at least two filters among the filters 321 to 327. That is, there are a plurality of sets of at least two filters that are subjected to simultaneous connection, in the filter group 30A. Each of filters in the sets of filters with which the second antenna switch 20A can be connected among the plurality of sets functions as the filter described in the first embodiment.

Specifically, between the plurality of second antenna switches 20A and 20B (plurality of fourth antenna switches), the second antenna switch 20A (fifth antenna switch) is configured to be able to be simultaneously connected with the filter 303 (fifth filter) among the plurality of filters 301 to 308 and 321 to 327 (plurality of third filters) and the filter 307 (sixth filter) among the plurality of filters 301 to 308 and 321 to 327. Between the plurality of second antenna switches 20A and 20B (plurality of fourth antenna switches), the second antenna switch 20B (sixth antenna switch) is configured to be able to be simultaneously connected with the filter 323 (seventh filter) among the plurality of filters 301 to 308 and 321 to 327 (plurality of third filters) and the filter 327 (eighth filter) among the plurality of filters 301 to 308 and 321 to 327.

The amplifier unit 40A includes a plurality of low noise amplifiers 401 to 413 and 421 to 431. Each of the low noise amplifiers 401 to 413 and 421 to 431 amplifies a signal coming through a corresponding filter. Each of the low noise amplifiers 401 to 413 is, for example, a low noise amplifier. An input terminal of each of the low noise amplifiers 401 to 413 and 421 to 431 is connected with an output terminal of a corresponding filter. An output terminal of each of the low noise amplifiers 401 to 413 and 421 to 431 is connected to the signal processing circuit 3.

A switch IC 100A that is a semiconductor device is configured by forming the second antenna switch 20A and the low noise amplifiers 401 to 413, which include the amplifier unit 40, in one chip. A switch IC 100B that is a semiconductor device is configured by forming the second antenna switch 20B and the low noise amplifiers 421 to 431, which include the amplifier unit 40, in one chip.

An arrangement of the first antenna switch 10A, the second antenna switches 20A and 20B, and a plurality of filters in the high-frequency module 1B will now be described. In this description, the filters 303, 304, 305, 307, 323, 324, 325, and 327 illustrated in FIG. 5 are used as the plurality of filters.

FIG. 6 illustrates a plan view of the high-frequency module 1B viewed in the first direction D1, and FIG. 7 illustrates a sectional view of the high-frequency module 1B. Here, FIG. 6 omits the first resin layer 61.

In the present embodiment, the filters 301 to 308 and 321 to 327 included in the filter group 30A are provided on the first main surface 2a, for example. On the second main surface 2b, the switch ICs 100A and 100B and the first antenna switch 10A are provided.

The switch ICs 100A and 100B and the first antenna switch 10A are arranged on the second main surface 2b of the mounting substrate 2, as described above (see FIG. 7). The second antenna switch 20A included in the switch IC 100A, the second antenna switch 20B included in the switch IC 100B, and the first antenna switch 10A are arranged along the second direction D2 (see FIGS. 6 and 7).

The second antenna switch 20A is connected with the first antenna switch 10A via a conductor 80A provided to the second main surface 2b. Specifically, the input terminal 201 of the second antenna switch 20A is connected with the output terminal 102 of the first antenna switch 10A via the conductor 80A (see FIG. 6).

The second antenna switch 20B is connected with the first antenna switch 10A via a conductor 80B provided to the second main surface 2b. Specifically, the input terminal 221 of the second antenna switch 20B is connected with the output terminal 122 of the first antenna switch 10A via the conductor 80B (see FIG. 6).

In plan view of the mounting substrate 2, the distance L11 between the external connection electrode 51 serving as the antenna terminal T1 and the first antenna switch 10A is shorter than the distance L12 between the antenna terminal T1 and the second antenna switch 20A.

In a similar manner, in plan view of the mounting substrate 2, a distance L21 between the external connection electrode 50 serving as the antenna terminal T2 and the first antenna switch 10A is shorter than a distance L22 between the antenna terminal T2 and the second antenna switch 20B.

The filters 303, 304, 305, and 307 are arranged on the first main surface 2a of the mounting substrate 2, as described above (see FIGS. 6 and 7). In the present embodiment, the filter 303 and the filter 307 are simultaneously connected with the second antenna switch 20A, and the filter 304 and the filter 305 are simultaneously connected with the second antenna switch 20A.

The filters 323, 324, 325, and 327 are arranged on the first main surface 2a of the mounting substrate 2, as described above (see FIGS. 6 and 7). In the present embodiment, the filter 323 and the filter 327 are simultaneously connected with the second antenna switch 20B, and the filter 324 and the filter 325 are simultaneously connected with the second antenna switch 20B.

The two filters 303 and 307 that are simultaneously connected are arranged along the second direction D2 (see FIG. 6). The two filters 304 and 305 that are simultaneously connected are arranged along the second direction D2 (see FIG. 6). The two filters 323 and 327 that are simultaneously connected are arranged along the second direction D2 (see FIG. 6). The two filters 324 and 325 that are simultaneously connected are arranged along the second direction D2 (see FIG. 6).

The filter 307 is connected with the second antenna switch 20A through a via 71A formed in the mounting substrate 2 (see FIG. 7). The filter 303 is connected with the second antenna switch 20A through a via 72A formed in the mounting substrate 2 (see FIG. 7). The filter 304 is connected with the second antenna switch 20A through a via (not illustrated) formed in the mounting substrate 2. The filter 305 is connected with the second antenna switch 20A through a via (not illustrated) formed in the mounting substrate 2.

The filter 327 is connected with the second antenna switch 20B through a via 71B formed in the mounting substrate 2 (see FIG. 7). The filter 323 is connected with the second antenna switch 20B through a via 72B formed in the mounting substrate 2 (see FIG. 7). The filter 324 is connected with the second antenna switch 20B through a via (not illustrated) formed in the mounting substrate 2. The filter 325 is connected with the second antenna switch 20B through a via (not illustrated) formed in the mounting substrate 2.

A distance between the first antenna switch 10A and the filter 303 is longer than a distance between the second antenna switch 20A and the filter 303. In a similar manner, a distance between the first antenna switch 10A and the filter 307 is longer than a distance between the second antenna switch 20A and the filter 307. A distance between the first antenna switch 10A and the filter 304 is longer than a distance between the second antenna switch 20A and the filter 304. A distance between the first antenna switch 10A and the filter 305 is longer than a distance between the second antenna switch 20A and the filter 305.

A distance between the first antenna switch 10A and the filter 323 is longer than a distance between the second antenna switch 20B and the filter 323. In a similar manner, a distance between the first antenna switch 10A and the filter 327 is longer than a distance between the second antenna switch 20B and the filter 327. A distance between the first antenna switch 10A and the filter 324 is longer than a distance between the second antenna switch 20B and the filter 324. A distance between the first antenna switch 10A and the filter 325 is longer than a distance between the second antenna switch 20B and the filter 325.

More specifically, at least one filter between the filter 303 and the filter 307 is overlapped with at least a portion of the second antenna switch 20A when the mounting substrate 2 is viewed in the first direction D1, that is, in plan view of the mounting substrate 2. In the present embodiment, both of the filter 303 and the filter 307 are respectively overlapped with at least portions of the second antenna switch 20A in plan view of the mounting substrate 2.

At least one filter between the filter 304 and the filter 305 is overlapped with at least a portion of the second antenna switch 20A in plan view of the mounting substrate 2. In the present embodiment, both of the filter 304 and the filter 305 are respectively overlapped with at least portions of the second antenna switch 20A in plan view of the mounting substrate 2.

In a similar manner, at least one filter between the filter 323 and the filter 327 is overlapped with at least a portion of the second antenna switch 20B when the mounting substrate 2 is viewed in the first direction D1, that is, in plan view of the mounting substrate 2. In the present embodiment, both of the filter 323 and the filter 327 are respectively overlapped with at least portions of the second antenna switch 20B in plan view of the mounting substrate 2.

At least one filter between the filter 324 and the filter 325 is overlapped with at least a portion of the second antenna switch 20B in plan view of the mounting substrate 2. In the present embodiment, both of the filter 324 and the filter 325 are respectively overlapped with at least portions of the second antenna switch 20B in plan view of the mounting substrate 2.

Further, at least one filter between the filter 303 and the filter 307 is overlapped with at least a portion of a corresponding low noise amplifier when the mounting substrate 2 is viewed in the first direction D1. In the present embodiment, the filter 303 is overlapped with at least a portion of the corresponding low noise amplifier 406 and the filter 307 is overlapped with at least a portion of the corresponding low noise amplifier 411 when the mounting substrate 2 is viewed in the first direction D1.

At least one filter between the filter 304 and the filter 305 is overlapped with at least a portion of a corresponding low noise amplifier when the mounting substrate 2 is viewed in the first direction D1. In the present embodiment, the filter 304 is overlapped with at least a portion of the corresponding low noise amplifier 407 and the filter 305 is overlapped with at least a portion of the corresponding low noise amplifier 408 when the mounting substrate 2 is viewed in the first direction D1.

At least one filter between the filter 323 and the filter 327 is overlapped with at least a portion of a corresponding low noise amplifier when the mounting substrate 2 is viewed in the first direction D1. In the present embodiment, the filter 323 is overlapped with at least a portion of the corresponding low noise amplifier 426 and the filter 327 is overlapped with at least a portion of the corresponding low noise amplifier 431 when the mounting substrate 2 is viewed in the first direction D1.

At least one filter between the filter 324 and the filter 325 is overlapped with at least a portion of a corresponding low noise amplifier when the mounting substrate 2 is viewed in the first direction D1. In the present embodiment, the filter 324 is overlapped with at least a portion of the corresponding low noise amplifier 427 and the filter 325 is overlapped with at least a portion of the corresponding low noise amplifier 428 when the mounting substrate 2 is viewed in the first direction D1.

As described above, at least one filter between the filter 304 and the filter 305 is overlapped with at least a portion of the second antenna switch 20A in plan view of the mounting substrate 2 in the present embodiment, as is the case with the first embodiment. In a similar manner, at least one filter between the filter 323 and the filter 327 is overlapped with at least a portion of the second antenna switch 20B when the mounting substrate 2 is viewed in the first direction D1, that is, in plan view of the mounting substrate 2.

This configuration can make, for example, the distance between the second antenna switch 20A and the filter 303 shorter than the distance between the first antenna switch 10A and the filter 303. Further, for example, the distance between the second antenna switch 20B and the filter 323 can be made shorter than the distance between the first antenna switch 10A and the filter 323. As a result, each of a wiring length between the second antenna switch 20A and the filter 303 and a wiring length between the second antenna switch 20B and the filter 323 can be shortened, being able to suppress degradation in identification of each filter.

Further, in plan view of the mounting substrate 2, the distance L11 between the antenna terminal T1 (external connection electrode 51) and the first antenna switch 10A is shorter than the distance L12 between the antenna terminal T1 and the second antenna switch 20A. Also, in plan view of the mounting substrate 2, the distance L21 between the antenna terminal T2 and the first antenna switch 10A is shorter than the distance L22 between the antenna terminal T2 and the second antenna switch 20B. Accordingly, possibility of signal loss generation is suppressed in each of the wiring between the antenna terminal T1 and the first antenna switch 10A and the wiring between the antenna terminal T2 and the first antenna switch 10A.

Thus, the high-frequency module 1B according to the second embodiment is capable of suppressing degradation in filter characteristics while suppressing possibility of signal loss generation in wiring from each of the antenna terminals T1 and T2.

Further, at least one filter between the filter 303 and the filter 307 is overlapped with at least a portion of a corresponding low noise amplifier when the mounting substrate 2 is viewed in the first direction D1. In a similar manner, at least one filter between the filter 323 and the filter 327 is overlapped with at least a portion of a corresponding low noise amplifier when the mounting substrate 2 is viewed in the first direction D1. This configuration can shorten the length of the path between the filter 303 and the low noise amplifier 406, for example. Further, the length of the path between the filter 323 and the low noise amplifier 406, for example, can be shortened.

The high-frequency module 1B according to the present embodiment includes the first antenna switch 10A and the second antenna switches 20A and 20B, making it possible to configure a module conforming with a plurality of communication systems, for example, an HB-DSM and a MIMO module. That is, the high-frequency module 1B is capable of performing communication of a plurality of communication systems.

The second antenna switch 20A may be formed with the first antenna switch 10A in one chip, in the present embodiment. Alternatively, the third antenna switch 10B, which functions as the first antenna switch 10 described in the first embodiment, between the plurality of third antenna switches 10B and 10C and the second antenna switch 20A may be formed in one chip in the configuration in which the plurality of third antenna switches 10B and 10C are not formed in one chip. In short, the second antenna switch 20A and at least the third antenna switch 10B, which functions as the first antenna switch 10 described in the first embodiment, may be formed in one chip.

SUMMARY

As described above, a high-frequency module (1; 1A; 1B) according to a first aspect includes a mounting substrate (2), an antenna terminal (T1), a first antenna switch (10), a second antenna switch (20; 20A), a first filter (for example, the filter 303), and a second filter (for example, the filter 307). The first antenna switch (10) includes a connection terminal (the input terminal 101) that is connected with the antenna terminal (T1) and a selection terminal (the output terminal 102) that is connected with the connection terminal. The second antenna switch (20; 20A) is connected with the selection terminal. The first filter and the second filter are connected with the second antenna switch (20; 20A). The second antenna switch (20; 20A) includes a common terminal (the input terminal 201), and a first selection terminal (for example, the output terminal 204) and a second selection terminal (for example, the output terminal 208) that are connected with the common terminal. The first filter is connected with the first selection terminal of the second antenna switch (20; 20A). The second filter is connected with the second selection terminal of the second antenna switch (20; 20A). The second antenna switch (20; 20A) is configured to be able to simultaneously execute the connection between the common terminal and the first selection terminal and the connection between the common terminal and the second selection terminal. In plan view of the mounting substrate (2), the distance between the antenna terminal (T1) and the first antenna switch (10) is shorter than the distance between the antenna terminal (T1) and the second antenna switch (20; 20A). Also, the distance between the first antenna switch (10) and the first filter is longer than the distance between the second antenna switch and the first filter.

This configuration realizes the short length of wiring between the second antenna switch (20; 20A) and the first filter, thereby being able to suppress degradation in filter identification of the first filter. The short length of wiring between the first antenna switch (10) and the antenna terminal (T1) is also realized, thereby being able to suppress the possibility of signal loss generation in the wiring between the antenna terminal (T1) and the first antenna switch (10). Accordingly, degradation in filter characteristics can be also suppressed while suppressing the possibility of signal loss generation in the wiring from the antenna terminal (T1).

In the high-frequency module (1; 1A; 1B) according to a second aspect, a distance between the first antenna switch (10) and the second filter is longer than a distance between the second antenna switch (20; 20A) and the second filter, in plan view of the mounting substrate (2), in the first aspect.

This configuration can suppress degradation in filter identification of the second filter.

In the high-frequency module (1; 1A; 1B) according to a third aspect, the mounting substrate (2) has a first main surface (2*a*) and a second main surface (2*b*) that face each other, in the first or second aspect. The first filter and the second filter are arranged on the first main surface (2*a*). At least one of the first antenna switch (10) and the second antenna switch (20; 20A) is arranged on the second main surface (2*b*).

According to this configuration, at least one of the first antenna switch (10) and the second antenna switch (20; 20A) is arranged on the second main surface (2*b*), being able to reduce an area for mounting electronic components on the mounting substrate (2). Consequently, downsizing of the high-frequency module (1; 1A; 1B) can be realized.

In the high-frequency module (1; 1A; 1B) according to a fourth aspect, both of the first antenna switch (10) and the second antenna switch (20; 20A) are arranged on the second main surface (2*b*), in the third aspect.

According to this configuration, downsizing of the high-frequency module (1; 1A; 1B) can be realized.

In the high-frequency module (1; 1A; 1B) according to a fifth aspect, the second antenna switch (20; 20A) is arranged on the second main surface (2*b*), in the third or fourth aspect. At least one filter between the first filter and the second filter (for example, the filter 307) is overlapped with at least a portion of the second antenna switch (20; 20A) in plan view of the mounting substrate (2).

This configuration realizes the short length of the path between the second antenna switch (20; 20A) and the filter that is overlapped with a portion of the second antenna switch (20; 20A) between the first filter and the second filter.

In the high-frequency module (1; 1A; 1B) according to a sixth aspect, the one filter is connected with the second antenna switch (20; 20A) through a via (for example, the via 71, 71A) formed in the mounting substrate (2), in the fifth aspect.

According to this configuration, the one filter and the second antenna switch (20; 20A) are connected with each other through the via, securely realizing the short length of the path between the one filter and the second antenna switch (20; 20A).

The high-frequency module (1; 1A; 1B) according to a seventh aspect further includes a first low noise amplifier (for example, the low noise amplifier 403) and a second low noise amplifier (for example, the low noise amplifier 411), in any one of the third to sixth aspects. The first low noise amplifier is connected with the first filter and amplifies a signal coming through the first filter. The second low noise amplifier is connected with the second filter and amplifies a signal coming through the second filter. The first low noise amplifier and the second low noise amplifier are arranged on the second main surface (2b).

According to this configuration, downsizing of the high-frequency module (1; 1A; 1B) can be realized while increasing flexibility in designing.

In the high-frequency module (1; 1A; 1B) according to an eighth aspect, the second antenna switch (20; 20A) is provided to the second main surface (2b), in the seventh aspect. The second antenna switch (20; 20A), the first low noise amplifier, and the second low noise amplifier are formed in one chip.

According to this configuration, downsizing of the high-frequency module (1; 1A; 1B) can be realized.

In the high-frequency module (1; 1A; 1B) according to a ninth aspect, in plan view of the mounting substrate (2), at least one filter between the first filter and the second filter is overlapped with at least a portion of a low noise amplifier that is connected with the one filter between the first low noise amplifier and the second low noise amplifier, in the seventh or eighth aspect.

This configuration realizes the short length of the path between one filter of the first and second filters and the low noise amplifier that is connected with the one filter between the first low noise amplifier and the second low noise amplifier.

The high-frequency module (1B) according to a tenth aspect includes a plurality of third antenna switches (10B, 10C), a plurality of fourth antenna switches (for example, the second antenna switches 20A, 20B), a plurality of third filters (for example, the filters 301 to 308, 321 to 327), and a plurality of fourth filters (for example, the filters 301 to 308, 321 to 327), in any one of the first to ninth aspects. The plurality of third antenna switches (10B, 10C) are respectively connected with antenna terminals (for example, the antenna terminal T1, the antenna terminal T2) that are different from each other. The plurality of fourth antenna switches respectively correspond to the plurality of third antenna switches and are connected with the corresponding third antenna switches (10B, 10C). Each of the plurality of third filters and the plurality of fourth filters is connected with a corresponding fourth antenna switch among the plurality of fourth antenna switches. A fifth antenna switch (for example, the second antenna switch 20A) among the plurality of fourth antenna switches is configured to be able to be simultaneously connected with a fifth filter (for example, the filter 303) among the plurality of third filters and a sixth filter (for example, the filter 307) among the plurality of fourth filters. A sixth antenna switch (for example, the second antenna switch 20B) among the plurality of fourth antenna switches is configured to be able to be simultaneously connected with a seventh filter (for example, the filter 323) among the plurality of third filters and an eighth filter (for example, the filter 327) among the plurality of fourth filters. One third antenna switch (10B) that is connected with the fifth antenna switch among the plurality of third antenna switches (10B, 10C) functions as the first antenna switch (10). The fifth antenna switch functions as the second antenna switch (20). The fifth filter and the sixth filter respectively function as the first filter and the second filter.

This configuration enables communication of a plurality of communication systems.

In the high-frequency module (1B) according to an eleventh aspect, among the plurality of third antenna switches (10B, 10C), the one third antenna switch (10B) and at least another third antenna switch (10C) that is different from the one third antenna switch (10B) are formed in one chip, in the tenth aspect.

According to this configuration, downsizing of the high-frequency module (1B) can be realized.

In the high-frequency module (1B) according to a twelfth aspect, the fifth antenna switch is formed with the one third antenna switch (10B) in one chip, in the tenth or eleventh aspect.

According to this configuration, downsizing of the high-frequency module (1B) can be realized.

In the high-frequency module (1B) according to a thirteenth aspect, the mounting substrate (2) has a first main surface (2a) and a second main surface (2b) that face each other in a thickness direction (first direction D1) of the mounting substrate (2), in any one of the tenth to twelfth aspects. The first filter and the second filter are arranged on the first main surface (2a). The one third antenna switch (10B) serving as the first antenna switch (10), the fifth antenna switch serving as the second antenna switch (20), the sixth antenna switch, and the another third antenna switch (10C) that is different from the one third antenna switch (10B) and is connected with the sixth antenna switch are arranged on the second main surface (2b).

According to this configuration, downsizing of the high-frequency module (1B) can be realized.

In the high-frequency module (1B) according to a fourteenth aspect, the seventh filter, the seventh filter being connected with the sixth antenna switch that is connected with another third antenna switch (10C) being different from the one third antenna switch (10B), among the plurality of third filters is overlapped with at least a portion of the sixth antenna switch in plan view of the mounting substrate (2), in any one of the tenth to thirteenth aspects. Alternatively, the eighth filter, which is connected with the sixth antenna switch, among the plurality of fourth filters is overlapped with at least a portion of the sixth antenna switch in plan view of the mounting substrate (2).

This configuration realizes the short length of the path between the seventh filter and the sixth antenna switch. Alternatively, the short length of the path between the eighth filter and the sixth antenna switch is realized.

A communication device (500; 500B) according to a fifteenth aspect includes the high-frequency module (1) according to any one of the first to fourteenth aspects and a signal processing circuit (3) that performs signal processing.

This configuration can suppress degradation in filter characteristics while suppressing the possibility of signal loss generation in the wiring from the antenna terminal (T1).

REFERENCE SIGNS LIST 1 high-frequency module
2 mounting substrate
2a first main surface
2b second main surface
3 signal processing circuit
4 antenna
10, 10A first antenna switch
10B, 10C third antenna switch
20 second antenna switch
20A second antenna switch (fourth antenna switch, fifth antenna switch)
20B second antenna switch (fourth antenna switch, sixth antenna switch)
71, 72, 71A, 72A via
101 input terminal (connection terminal)
102 output terminal (selection terminal)
201 input terminal (common terminal)
204 output terminal (first selection terminal)
208 output terminal (second selection terminal)
301 to 308, 321 to 327 filter
401 to 413, 421 to 431 low noise amplifier
500 communication device
T1 antenna terminal
T2 antenna terminal
D1 first direction

The invention claimed is:

1. A high-frequency module comprising:
a mounting substrate;
an antenna terminal;
a first antenna switch that includes a connection terminal and a selection terminal, the connection terminal being connected with the antenna terminal, and the selection terminal being connected with the connection terminal;
a second antenna switch that is connected with the selection terminal; and
a first filter and a second filter that are connected with the second antenna switch,
wherein the second antenna switch includes a common terminal, a first selection terminal, and a second selection terminal, the first selection terminal and the second selection terminal being connected with the common terminal,
wherein the first filter is connected with the first selection terminal of the second antenna switch,
wherein the second filter is connected with the second selection terminal of the second antenna switch,
wherein the second antenna switch is configured to simultaneously execute connection between the common terminal and the first selection terminal and connection between the common terminal and the second selection terminal,
wherein in plan view of the mounting substrate, a distance between the antenna terminal and the first antenna switch is shorter than a distance between the antenna terminal and the second antenna switch, and a distance between the first antenna switch and the first filter is longer than a distance between the second antenna switch and the first filter,
wherein the mounting substrate has a first main surface and a second main surface that face each other,
wherein the first filter and the second filter are arranged on the first main surface, and
wherein the first antenna switch and the second antenna switch are on the second main surface.

2. The high-frequency module according to claim 1, wherein a distance between the first antenna switch and the second filter is longer than a distance between the second antenna switch and the second filter, in plan view of the mounting substrate.

3. The high-frequency module according to claim 1, wherein at least one of the first filter and the second filter is overlapped with at least a portion of the second antenna switch in plan view of the mounting substrate.

4. The high-frequency module according to claim 3, wherein the one filter is connected with the second antenna switch through a via in the mounting substrate.

5. The high-frequency module according to claim 4, further comprising:
a first low noise amplifier that is connected with the first filter and that amplifies a signal coming through the first filter; and
a second low noise amplifier that is connected with the second filter and that amplifies a signal coming through the second filter, wherein
the first low noise amplifier and the second low noise amplifier are on the second main surface.

6. The high-frequency module according to claim 3, further comprising:
a first low noise amplifier that is connected with the first filter and that amplifies a signal coming through the first filter; and
a second low noise amplifier that is connected with the second filter and that amplifies a signal coming through the second filter,
wherein the first low noise amplifier and the second low noise amplifier are on the second main surface.

7. The high-frequency module according to claim 1, further comprising:
a first low noise amplifier that is connected with the first filter and that amplifies a signal coming through the first filter; and
a second low noise amplifier that is connected with the second filter and that amplifies a signal coming through the second filter, wherein
the first low noise amplifier and the second low noise amplifier are on the second main surface.

8. The high-frequency module according to claim 7, wherein the second antenna switch, the first low noise amplifier, and the second low noise amplifier are in one chip.

9. The high-frequency module according to claim 7, wherein in plan view of the mounting substrate, at least one filter between the first filter and the second filter is overlapped with at least a portion of a low noise amplifier that is connected with the one of the first low noise amplifier and the second low noise amplifier.

10. The high-frequency module according to claim 1, comprising:
a plurality of third antenna switches that are respectively connected with different antenna terminals;
a plurality of fourth antenna switches that respectively correspond to the plurality of third antenna switches and are respectively connected with the corresponding third antenna switches; and
a plurality of third filters and a plurality of fourth filters each of which is respectively connected with a corresponding fourth antenna switch of the plurality of fourth antenna switches, wherein the plurality of fourth antenna switches comprises a fifth antenna switch and a six antenna switch, the plurality of third filters comprises a fifth filter and a seventh filter, the plurality of fourth filters comprises a sixth filter and a eight filter, the fifth antenna switch is configured to be simultaneously connected with the fifth filter and the sixth filter, the sixth antenna switch is configured to be simultaneously connected with the seventh filter and then eighth filter, one of the plurality of third antenna switches being connected with the fifth antenna switch functions as the first antenna switch, the fifth antenna switch functions as the second antenna switch, and the fifth filter and the sixth filter respectively function as the first filter and the second filter.

11. The high-frequency module according to claim 10, wherein among the plurality of third antenna switches, the one of the plurality of third antenna switches and at least one another third antenna switch that is different from the one of the plurality of third antenna switches are in one chip.

12. The high-frequency module according to claim 10, wherein the fifth antenna switch and the one of the plurality of third antenna switches are in one chip.

13. The high-frequency module according to claim 10, wherein the one of the plurality of third antenna switches serving as the first antenna switch, the fifth antenna switch serving as the second antenna switch, the sixth antenna switch, and another third antenna switch are on the second main surface, the another third antenna switch being different from the one of the plurality of third antenna switches and being connected with the sixth antenna switch.

14. The high-frequency module according to claim 10, wherein the seventh filter is overlapped with at least a portion of the sixth antenna switch in plan view of the mounting substrate, or wherein the eighth filter is overlapped with at least a portion of the sixth antenna switch in plan view of the mounting substrate.

15. A communication device comprising:

the high frequency module according to claim 1; and a signal processing circuit that performs signal processing.

* * * * *